United States Patent
Oh et al.

(10) Patent No.: US 9,787,266 B2
(45) Date of Patent: Oct. 10, 2017

(54) METHOD AND AN APPARATUS FOR PROCESSING AN AUDIO SIGNAL

(71) Applicant: LG ELECTRONICS INC., Seoul (KR)

(72) Inventors: Hyen O Oh, Seoul (KR); Yang Won Jung, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 15/077,765

(22) Filed: Mar. 22, 2016

(65) Prior Publication Data

US 2016/0205490 A1 Jul. 14, 2016

Related U.S. Application Data

(63) Continuation of application No. 14/133,249, filed on Dec. 18, 2013, now Pat. No. 9,319,014, which is a
(Continued)

(30) Foreign Application Priority Data

Jan. 22, 2009 (KR) ........................ 10-2009-0005506

(51) Int. Cl.
*G06F 17/00* (2006.01)
*H03G 3/00* (2006.01)
(Continued)

(52) U.S. Cl.
CPC ............. *H03G 3/00* (2013.01); *G10L 19/008* (2013.01); *G11B 20/10* (2013.01); *H04S 7/30* (2013.01);
(Continued)

(58) Field of Classification Search
CPC ... H03G 3/00; H04S 2400/03; H04S 2400/11; H04S 7/30; H04S 2420/03; G10L 19/008; G06F 3/00; G06F 3/01; G11B 20/10
(Continued)

(56) References Cited

U.S. PATENT DOCUMENTS 5,798,818 A 8/1998 Derderian et al.
6,704,421 B1 3/2004 Kitamura
(Continued)

FOREIGN PATENT DOCUMENTS

CN 1711800 A 12/2005
CN 1947172 A 4/2007
(Continued)

OTHER PUBLICATIONS

"Call for Proposals on Spatial Audio Object Coding", International Organisation for Standardisation, pp. 1-20, Jan. 2007. (XP030015347).
(Continued)

*Primary Examiner* — Paul McCord
(74) *Attorney, Agent, or Firm* — Birch, Stewart, Kolasch & Birch, LLP

(57) ABSTRACT

A method of processing an audio signal is provided. A decoding apparatus receives the audio signal, which includes a plurality of objects. The decoding apparatus further receives object information, object gain information, and object correlation information, preset presence information, preset number information, preset information based on the preset presence information and the preset number information, and preset rendering data. The preset information exists in a header region or in each frame. The decoding apparatus obtains a preset matrix from the user by an input unit of the audio decoding apparatus when the preset type information indicates the preset rendering data is defined by the user, and adjusts an output level of the plurality of objects for an output channel based on the object information and the preset matrix. The decoding apparatus outputs an adjusted audio signal including the plurality of objects with an adjusted output level.

6 Claims, 14 Drawing Sheets

Related U.S. Application Data continuation of application No. 12/358,982, filed on Jan. 23, 2009, now Pat. No. 8,615,316.

(60) Provisional application No. 61/023,051, filed on Jan. 23, 2008.

(51) Int. Cl.
*G10L 19/008* (2013.01)
*H04S 7/00* (2006.01)
*G11B 20/10* (2006.01)
*G06F 3/00* (2006.01)
*G06F 3/01* (2006.01)

(52) U.S. Cl.
CPC ............... *G06F 3/00* (2013.01); *G06F 3/01* (2013.01); *H04S 2400/03* (2013.01); *H04S 2400/11* (2013.01); *H04S 2420/03* (2013.01)

(58) Field of Classification Search
USPC .......................................................... 700/94
See application file for complete search history.

(56) References Cited

U.S. PATENT DOCUMENTS

| | | |
|---|---|---|
| 6,946,982 B1 | 9/2005 | Mu et al. |
| 7,013,301 B2 | 3/2006 | Holm et al. |
| 7,190,292 B2 | 3/2007 | Bizjak |
| 7,526,348 B1 | 4/2009 | Marshall et al. |
| 7,613,306 B2 | 11/2009 | Miyasaka et al. |
| 7,613,531 B2 | 11/2009 | Korst et al. |
| 2001/0056471 A1 | 12/2001 | Negishi et al. |
| 2002/0118840 A1 | 8/2002 | Irwan et al. |
| 2003/0125933 A1 | 7/2003 | Saunders et al. |
| 2003/0212466 A1 | 11/2003 | Alferness |
| 2004/0111171 A1 | 6/2004 | Jang et al. |
| 2004/0237750 A1 | 12/2004 | Smith et al. |
| 2005/0038819 A1 | 2/2005 | Hicken et al. |
| 2005/0074127 A1 | 4/2005 | Herre et al. |
| 2005/0141728 A1 | 6/2005 | Moorer |
| 2005/0281408 A1 | 12/2005 | Kim et al. |
| 2006/0174267 A1 | 8/2006 | Schmidt |
| 2007/0219808 A1 | 9/2007 | Herre et al. |
| 2007/0236858 A1 | 10/2007 | Disch et al. |
| 2008/0080722 A1 | 4/2008 | Carroll et al. |
| 2008/0097750 A1 | 4/2008 | Seefeldt et al. |

FOREIGN PATENT DOCUMENTS

| | | |
|---|---|---|
| EP | 1416769 A1 | 5/2004 |
| EP | 1473971 A2 | 11/2004 |
| EP | 1853093 A1 | 11/2007 |
| JP | 2003-529877 A | 10/2003 |
| JP | 2003-531555 A | 10/2003 |
| JP | 2005-242126 A | 9/2005 |
| JP | 2006-323408 A | 11/2006 |
| JP | 2007-178590 A | 7/2007 |
| JP | 2008-511848 A | 4/2008 |
| JP | 2009-537876 A | 10/2009 |
| JP | 2010-507927 A | 3/2010 |
| KR | 10-0542129 B1 | 1/2006 |
| KR | 10-2007-0005468 A | 1/2007 |
| KR | 10-2007-0031212 A | 3/2007 |
| KR | 10-2007-0044352 A | 4/2007 |
| KR | 10-2007-0061100 A | 6/2007 |
| KR | 10-2007-0079943 A | 8/2007 |
| KR | 10-20070092164 A | 9/2007 |
| KR | 10-2008-0029940 A | 4/2008 |
| RU | 2006114742 A | 11/2007 |
| WO | WO 97/25834 A2 | 7/1997 |
| WO | WO 01/75885 A2 | 10/2001 |
| WO | WO 2005/101370 A1 | 10/2005 |
| WO | WO 2006/027138 A1 | 3/2006 |
| WO | WO 2006/056910 A1 | 6/2006 |
| WO | WO 2006/091540 A2 | 8/2006 |
| WO | WO 2006/132857 A2 | 12/2006 |
| WO | WO 2007/027051 A1 | 3/2007 |
| WO | WO 2007/027055 A1 | 3/2007 |
| WO | WO 2007/083958 A1 | 7/2007 |
| WO | WO 2007/091870 A1 | 8/2007 |
| WO | WO 2007/128523 A1 | 11/2007 |
| WO | WO 2007/136187 A1 | 11/2007 |

OTHER PUBLICATIONS

ID3: informatl standard; Copyright Nov. 1, 2000.
Jurgen Herre et al., "New Concepts in Parametic Coding of Spatial Audio: From SAC to SAOC", pp. 1894-1897, International Conference on Multimedia and Expo, 2007 IEEE. Germany. (XP031124020).
Pihkala, K. et al., "Extending SMIL with 3D Audio," International Conf. on Auditory Display, Boston, USA, Jul. 6-9, 2003.
Stoll G., "MPEG audio layer II: A generic coding standard for two and multichannel sound for DVB, DAB and computer multimedia" International Broadcasting Convention, pp. 136-144, 1995. (XP006528918).
Taejin Lee et al., "Personalized Audio Broadcasting System through the Terrestrial-DMB System", Electronics and Telecommunications Research Institute, Korea, 2007. (XP031071625).
"Text of ISO/IEC 23003-1:2006/FCD, MPEG Surround," International Organization for Standardization, 186 pages, Jan. 2006, Bangkok, Thailand. (XP30014439A).
Newell, C. Informal standard, id3v2-chapters-1.0, pp. 1-5, Dec. 2, 2005.

FIG. 5

```
Header()
{
   ...
   bsNumPresets;
   If (bsNumPresets)
   {
      numPresets = bsNumPresets + 1;

for (i=0; i<numPresets; i++)
         bsPresetType[i]
            if(bsPresetType[i])
               bsPresetCh[i];
                  getRenderingMatrix()
   }
}
```

FIG. 6

```
Header()
{
   ...
   bsPresetExists;
   If (bsPresetExists)
   {
      bsNumPresets;
      numPresets = bsNumPresets + 1;

for (i=0; i<numPresets; i++) {
         bsPresetType[i];
         if (bsPresetType[i])
            bsPresetCh[i];
         bsPresetTimeVarying[i];
      }
   }
}
```

FIG. 7

```
Header()
{
   ...
   bsNumPresets;
   If (bsNumPresets)
   {
      numPresets = bsNumPresets + 1;

for (i=0; i<numPresets; i++)
        for (j=0;j<numObjects;j++)
          bsPresetObject[i][j];
   }
}
```

FIG. 9

```
Frame()
{
    ...
    If (bsPresetExitst) (or If (bsNumPresets))
    {
        for (i=0;i<numPresets;i++)
        {
            getGain();
            if (bsPresetType[i])
            {
                getPanning();
            }
        }
    }
}
```

(A)

(B)

METHOD AND AN APPARATUS FOR PROCESSING AN AUDIO SIGNAL

CROSS REFERENCE TO RELATED APPLICATIONS

The present application is a Continuation of U.S. patent application Ser. No. 14/133,249, filed on Dec. 18, 2013, which is a Continuation of U.S. patent application Ser. No. 12/358,982, filed Jan. 23, 2009, now U.S. Pat. No. 8,615,316, which claims the benefit of the Korean Patent Application No. 10-2009-0005506, filed on Jan. 22, 2009, which claims the benefit of the U.S. Provisional Patent Application No. 61/023,051, filed on Jan. 23, 2008, the entire contents of which are hereby incorporated by reference as if fully set forth herein

TECHNICAL FIELD

The present invention relates to a method and apparatus for processing an audio signal, and more particularly, to an apparatus for processing an audio signal and method thereof. Although the present invention is suitable for a wide scope of applications, it is particularly suitable for processing an audio signal received as a digital medium, a broadcast signal or the like.

BACKGROUND ART

Generally, in the course of generating a downmix signal by downmixing an audio signal including a plurality of objects into a mono or stereo signal, parameters (information) are extracted from the objects. Theses parameters (information) are used for a process for decoding a downmixed signal. And, pannings and gains of the objects can be controlled by a selection made by a user.

DISCLOSURE OF THE INVENTION

Technical Problem

However, objects included in a downmix signal should be appropriately controlled by a user's selection. When a user controls an object, it is inconvenient for the user to control the object in direct. And, it may be more difficult to restore an optimal status of an audio signal including a plurality of objects according to an environment than to be controlled by an expert.

Technical Solution

Accordingly, the present invention is directed to an apparatus for processing an audio signal and method thereof that substantially obviate one or more of the problems due to limitations and disadvantages of the related art.

An object of the present invention is to provide an apparatus for processing an audio signal and method thereof, by which an object included in an audio signal can be controlled using preset information including preset metadata and preset rendering data.

Another object of the present invention is to provide an apparatus for processing an audio signal and method thereof, by which a level of an object in an output channel can be adjusted in a manner of determining preset rendering data based on output-channel information of an audio signal and then applying the preset rendering data to the audio signal, in case that a preset rendering data type is a matrix.

A further object of the present invention is to provide an apparatus for processing an audio signal and method thereof, by which a preset rendering matrix for adjusting an object is generated step by step from a mono type preset rendering matrix transferred from an encoder or gain information.

Advantageous Effects

Accordingly, the present invention provides the following effects or advantages.

First of all, the present invention selects one of previously-set preset information without user's setting for objects, thereby facilitating a level of an output channel to be adjusted.

Secondly, the present invention represents preset metadata for representing preset information as a text based on preset length information indicating a length of metadata, thereby reducing unnecessary coding.

Thirdly, in case that a type of preset rendering data is a matrix, the present invention determines a preset matrix indicating the preset rendering data based on output-channel information of an audio signal, thereby adjusting a level of an output channel of an object more precisely and efficiently.

Fourthly, the present invention generates a preset matrix step by step, thereby reducing a bitrate from an encoder.

Fifthly, the present invention uses a preset matrix for adjusting objects in part only, thereby reducing unnecessary coding.

DESCRIPTION OF DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 5 is a diagram of a syntax according to an embodiment of the present invention;

FIG. 6 is a diagram of a syntax according to another embodiment of the present invention;

FIG. 7 is a diagram of a syntax according to a further embodiment of the present invention;

FIG. 9 is a diagram of a syntax according to another further embodiment of the present invention;

BEST MODE

Figure 1:
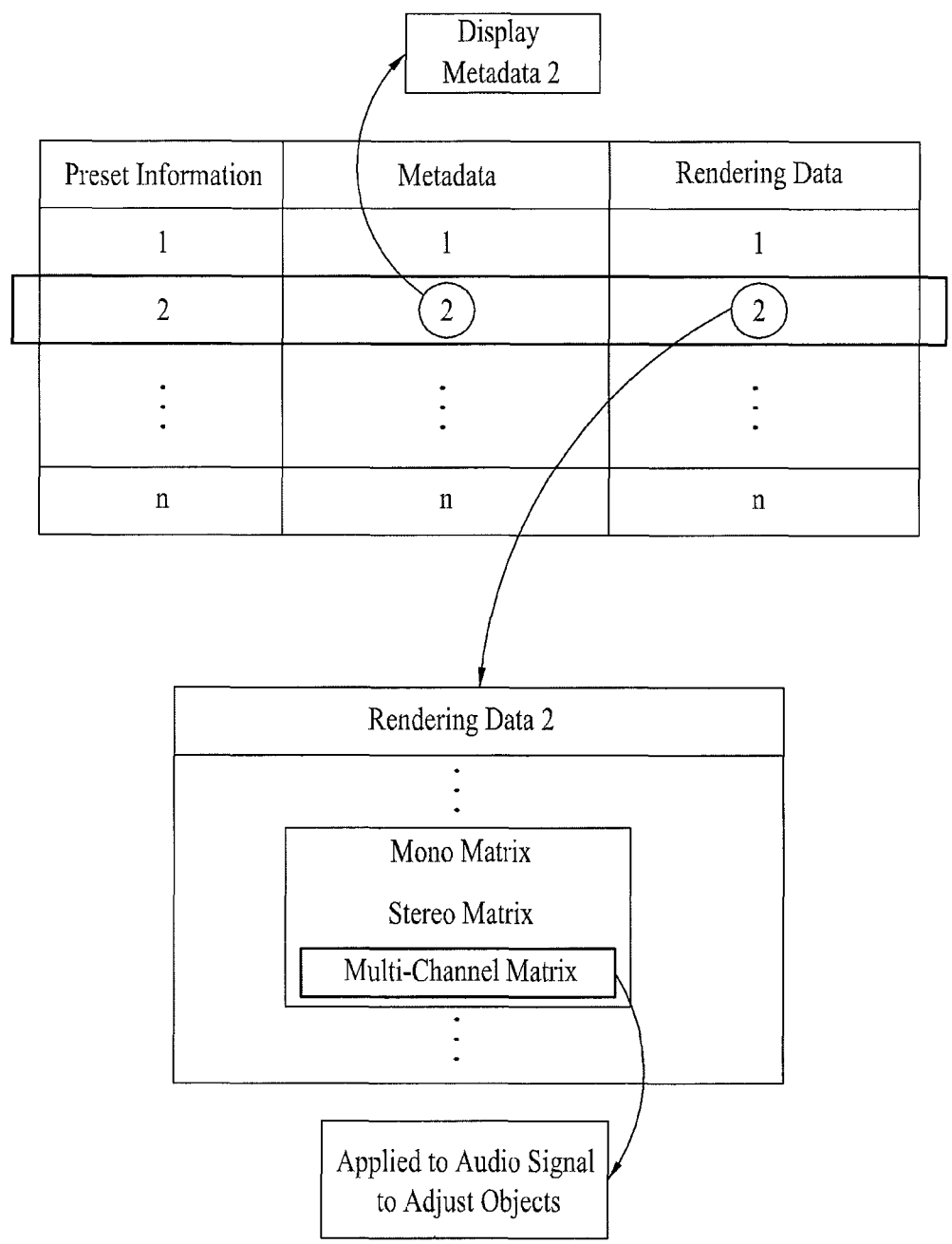
FIG. 1 is a conceptional diagram of preset information applied to an object included in an audio signal according to an embodiment of the present invention.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, a method of processing an audio signal according to the present invention includes receiving the audio signal and preset information, wherein the audio signal includes at least one object; obtaining preset matrix from the preset information, wherein the preset matrix indicates contribution degree of the object to output channel; adjusting output level of the object according to the output channel by using the preset matrix; and outputting an audio signal including the object with adjusted output level, wherein the preset information is obtained based on preset presence information indicating that the preset information exists and preset number information indicating number of the preset information, wherein the preset matrix is obtained based on preset type information indicating that the preset information is represented in matrix.

Preferably, the preset matrix is obtained based on output-channel information indicating that the output channel is one of mono, stereo and multi-channel.

Preferably, the preset type information is represented in 1 bit.

More preferably, dimension of the preset matrix is determined based on number of the object and number of the output channel.

To further achieve these and other advantages and in accordance with the purpose of the present invention, an apparatus for processing an audio signal according to the present invention includes an audio signal receiving unit receiving the audio signal including at least one object; a preset metadata receiving unit receiving preset metadata from preset information, wherein the preset metadata receiving unit obtains at least one of the preset metadata from at least one of the preset information; a preset rendering data receiving unit obtaining preset matrix from the preset information, wherein the preset matrix indicates contribution degree of the object to output channel and wherein the preset matrix corresponds to the preset metadata; a display unit displaying the preset metadata; an input unit receiving command for selecting one of the preset metadata; an object adjusting unit adjusting output level of the object according to the output channel by using the preset matrix corresponding to the selected preset metadata; and an output unit outputting an audio signal including the object with adjusted output level. Preferably, the display unit displays the selected preset metadata, when the output unit outputs the audio signal.

Preferably, the display unit further displays the output level of the object.

Preferably, the preset matrix is obtained based on output-channel information indicating that the output channel is one of mono, stereo and multi-channel.

Preferably, the preset information is obtained based on preset number information indicating number of the preset information and wherein the preset matrix is obtained based on preset type information indicating that preset information is represented in matrix.

Preferably, the preset information further comprises preset object applying information indicating whether the preset matrix to be applied to the objects exists.

Preferably, the display unit further displays whether the preset matrix to be applied to the object exists based on the preset object applying information.

More preferably, the display unit displays the preset metadata in text.

It is to be understood that both the foregoing general description and the following detailed description are exemplary and explanatory and are intended to provide further explanation of the invention as claimed.

MODE FOR INVENTION

Reference will now be made in detail to the preferred embodiments of the present invention, examples of which are illustrated in the accompanying drawings.

First of all, 'information' in this disclosure is construed as the terminology that generally includes values, parameters, coefficients, elements and the like an 'object' can be construed as a source signal configuring an audio signal of a guitar, vocal, piano or the like. Their meaning can be construed as different occasionally, by which the present invention is non-limited.

In decoding an audio signal including a plurality of objects, the present invention provides a method of effectively decoding the audio signal using one of previously-set informations for adjusting the objects.

FIG. 1 is a conceptional diagram of preset information applied to an object included in an audio signal according to an embodiment of the present invention. In this disclosure, previously-set information for adjusting the object is named preset information. The preset information can indicate one of various modes selectable according to a characteristic of an audio signal or a listening environment. And, there can exist a plurality of preset information. Moreover, the preset information includes metadata for representing an attribute of the preset information or the like and rendering data applied to adjust the object. The metadata can be represented in a text type. The metadata not only indicates an attribute (e.g., concert hall mode, karaoke mode, news mode, etc.) of the preset information but also includes such relevant information for representing the preset information as a writer of the preset information, a written date, a name of an object having the preset information applied thereto and the like. Meanwhile, the rendering data is the data that is substantially applied to the object. The rendering data can have one of various forms. Particularly, the rendering data can exist in a matrix type.

Referring to FIG. 1, preset information 1 may be a concert hall mode for providing sound stage effect enabling a music signal to be heard in a concert hall. Preset information 2 can be a karaoke mode for reducing a level of a vocal object in an audio signal. And, preset information n can be a news mode for raising a level of a speech object. Moreover, the preset information 2 includes metadata 2 and rendering data 2. If a user selects the preset information 2, the karaoke mode of the metadata 2 will be realized in a display unit and it is able to adjust a level by applying the rendering data 2 relevant to the metadata 2 to the object.

In this case, if rendering data is in a matrix type, it can include a mono matrix, a stereo matrix, or a multi-channel matrix. The mono matrix is the rendering data applied if an output channel of the object is mono. The stereo matrix is the rendering data applied if an output channel of the object is stereo. And, the multi-channel matrix is the rendering data applied if an output channel of the object is a multi-channel. Once an output channel of the object is determined, a matrix is determined using the determined output channel. It is then able to adjust a level by applying the matrix to the object.

Thus, using the metadata and the rendering data included in the preset information, the object is adjusted and an attribute or feature of the applied preset information is represented. Therefore, it is able to efficiently provide an audio signal having a user-specific effect.

Figure 2:
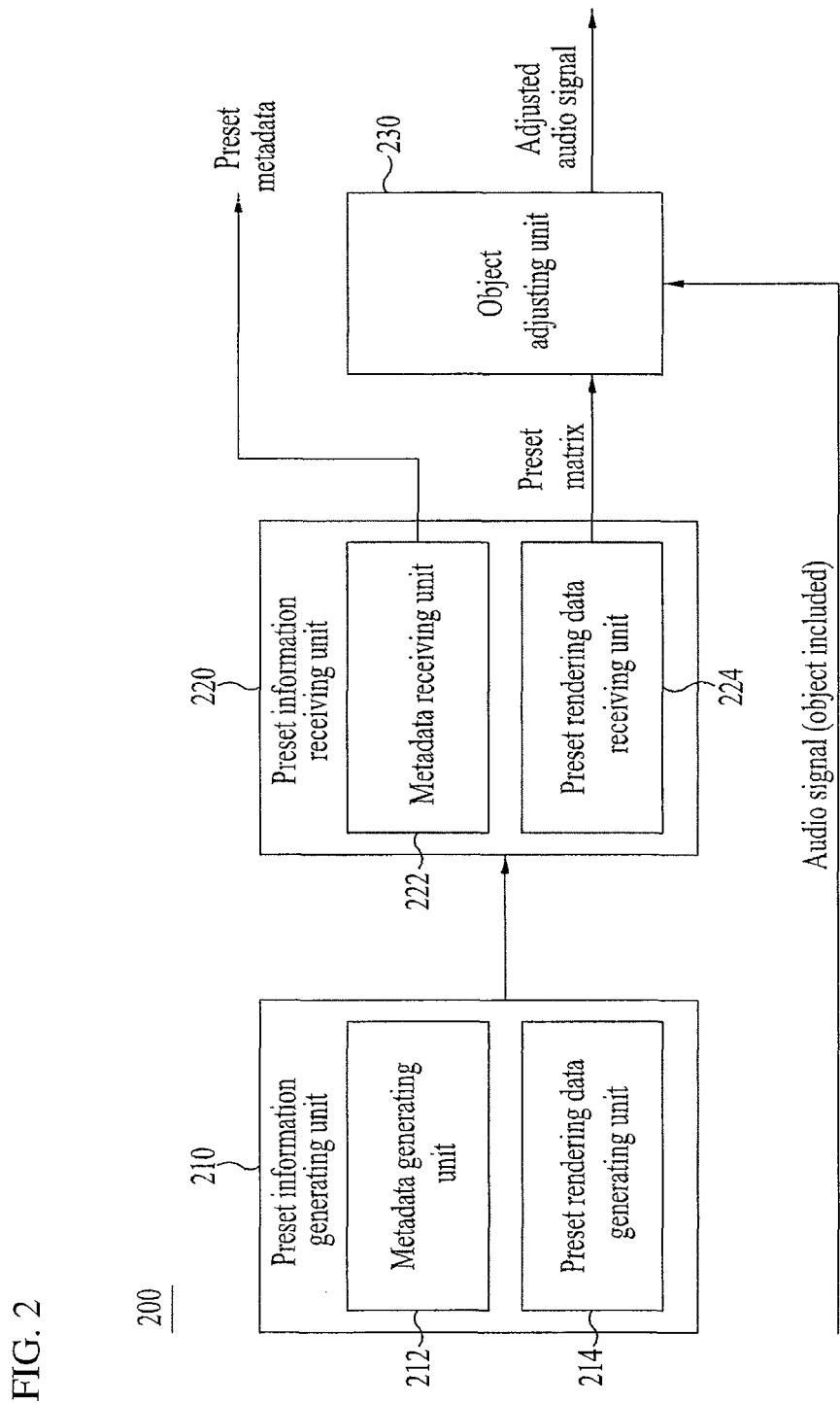
FIG. 2 is a block diagram of an audio signal processing apparatus according to an embodiment of the present invention.

FIG. 2 is a block diagram of an audio signal processing apparatus 200 according to an embodiment of the present invention.

Referring to FIG. 2, an audio signal processing apparatus 200 according to an embodiment of the present invention can include a preset information generating unit 210 and a preset information receiving unit 2210 and an object adjusting unit 230.

The preset information generating unit 210 generates preset information for adjusting an object included in an audio signal. The preset information generating unit 210 can include a metadata generating unit 212 and a preset rendering data generating unit 214. The metadata generating unit 212 receives an input of text information for representing the preset information and is then able to generate preset metadata. As mentioned in the foregoing description, the preset metadata can be the information for representing a characteristic or attribute of the preset information. In this case, a metadata generating unit 212 can further generate preset length information indicating a character length number of the preset metadata. In this case, the preset length information can be represented as bytes, by which examples of the preset length information are non-limited.

Meanwhile, if information for a gain for adjusting a level of the object and a panning of the object is inputted to the preset rendering data generating unit 214, it is able to generate preset rendering data to apply to the object. In this case, the preset rendering data can be generated per object and can be implemented in one of various types. For instance, the preset rendering data can be a preset matrix implemented in a matrix type. Moreover, the preset rendering data generating unit 214 can further generate preset type information (preset_type_flag) indicating whether the preset rendering data is represented in matrix. Besides, the preset rendering data generating unit 214 can further generate output-channel information indicating how many output channels the object have.

The preset length information and preset metadata generated by the metadata generating unit 212 and the preset type information, output-channel information and preset rendering data generated by the preset rendering data generating unit 214 can be transported by being included in one bitstream, and more particularly, by being included in an ancillary region of a bitstream including an audio signal.

Meanwhile, the preset information generating unit 210 can further generate preset presence information indicating whether the preset length information, the preset metadata, the preset type information, the output-channel information and the preset rendering data are included in a bitstream. The preset presence information can have a container type indicating information on the preset information exists in which region or a flag type, by which examples of the preset presence information are non-limited.

Moreover, the preset information generating unit 210 is able to generate preset information. Each of the preset information includes the preset length information, the preset metadata, the preset type information, the output-channel information and the preset rendering data. In this case, the preset generating unit 210 can further generate preset number information indicating the number of the preset information.

The preset information receiving unit 220 receives preset information generated and transmitted by the preset information generating unit 210. And, the preset information receiving unit 220 can include a metadata receiving unit 222 and a preset rendering data receiving unit 224.

The metadata receiving unit 222 receives and then outputs the preset metadata and the preset rendering data receiving unit 224 receives the preset rendering data (e.g., preset matrix), of which details will be explained with reference to FIG. 3 and FIG. 4.

And, the object adjusting unit 230 receives an audio signal including a plurality of objects and the preset rendering data generated by the rendering data receiving unit 224. In this case, the preset rendering data is applied to the object, whereby a level or position of the object can be adjusted.

Figure 3:
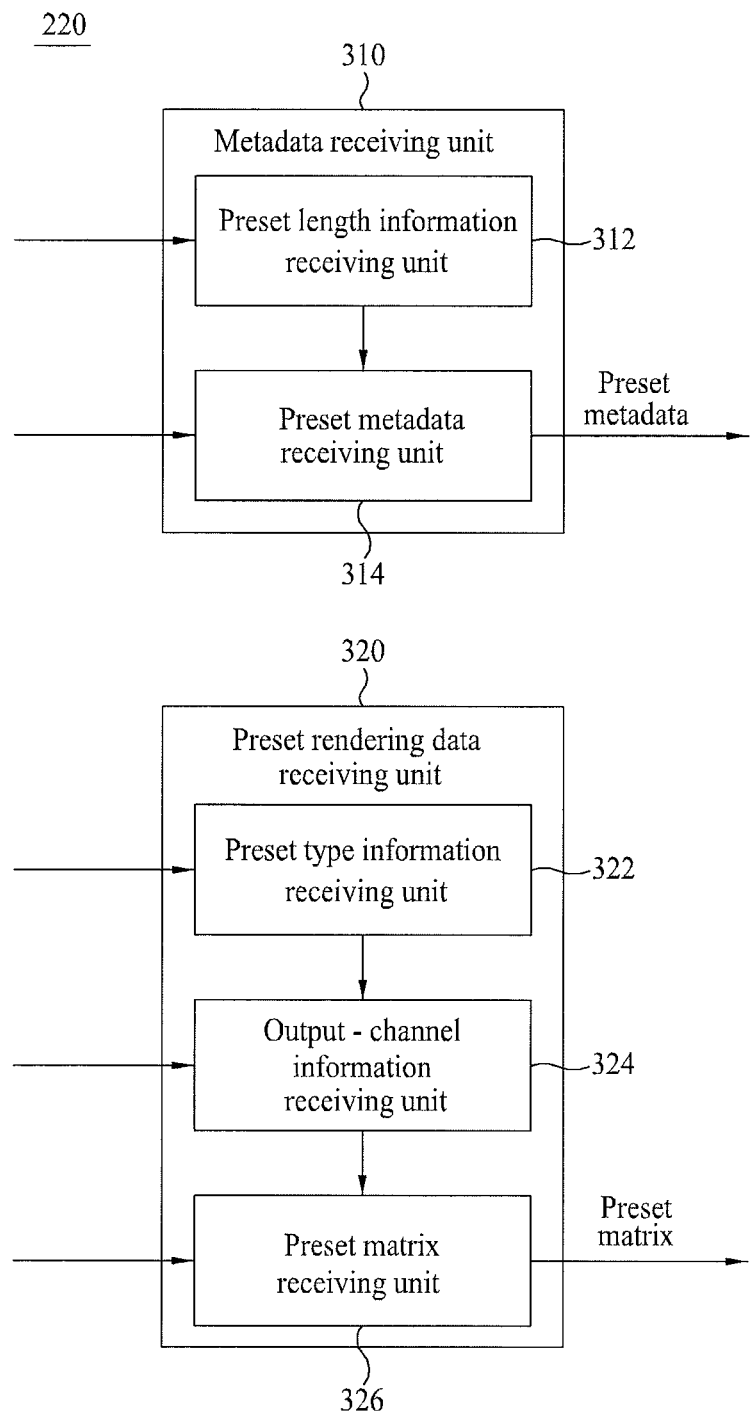
FIG. 3 is a block diagram of a preset receiving unit in an audio signal processing apparatus according to an embodiment of the present invention.

FIG. 3 is a block diagram of a metadata receiving unit 310 and preset rendering data receiving unit 320 included in a preset receiving unit 200 of an audio signal processing apparatus 200 according to an embodiment of the present invention.

Referring to FIG. 3, a metadata receiving unit 310 includes a preset length information receiving unit 312 and a preset metadata receiving unit 314. The preset length information receiving unit 312 receives preset length information indicating a length of preset metadata for representing the preset information and then obtains the length of the preset metadata. Subsequently, the preset metadata receiving unit 314 reads a bitstream amounting to the length indicated by the preset length information and then receives the preset metadata. Moreover, the preset metadata receiving unit 314 converts the preset metadata, which is the metadata indicating a type or attribute of the preset information, to a text type and then outputs the converted preset metadata of the text type.

The preset rendering data receiving unit 320 includes a preset type flag receiving unit 322, an output-channel information receiving unit 324 and a preset matrix receiving unit 326. The preset data type flag receiving unit 322 receives a preset type flag (preset_type_flag) indicating whether the preset rendering data has a matrix type. In this case, the meaning of the preset type flag is shown in Table 1.

TABLE 1

| Preset type flag | Meaning |
| --- | --- |
| 0 | Type of preset rendering data is not matrix. |
| 1 | Type of preset rendering data is matrix. |

If the preset type flag indicates a case that a type of preset rendering data is matrix, the output-channel information receiving unit 324 receives output-channel information indicating the number of output channels on which object included in an audio signal will be played back. The output-channel information can include mono channel, stereo channel or multi-channel (5.1 channel), by which examples of the output-channel information is non-limited.

The present matrix receiving unit 326 receives and outputs a preset matrix indicating contribution degree of the object to output channel and corresponding to the preset metadata based on the output-channel information. In this case, the preset matrix can include one of a mono preset matrix, a stereo preset matrix and a multi-channel preset matrix. Dimension of the preset matrix is determined based on number of the object and number of the output channel. Therefore, the preset matrix may have a form of (the umber of objects)*(the number of output channels). For instance, if there are n objects included in an audio signal and an output channel from the output-channel information receiving unit 324 corresponds to 5.1 channel (i.e., six channels), the preset matrix receiving unit 326 is able to put a preset multi-channel matrix shown in Formula 1 implemented in n*6 form.

[Formula 1]
$$M_{ren} = \begin{bmatrix} m_{0,Lf} & m_{0,Rf} & m_{0,C} & m_{0,Lfe} & m_{0,Ls} & m_{0,Rs} \\ \cdots & \cdots & \cdots & \cdots & \cdots & \cdots \\ m_{N-1,Lf} & m_{N-1,Rf} & m_{N-1,C} & m_{N-1,Lfe} & m_{N-1,Ls} & m_{N-1,Rs} \end{bmatrix}$$

In Formula 1, a matrix component $m_{a,b}$ is a gain value indicating an extent that an ath object is included in a bth channel. Subsequently, the preset multi-channel matrix can adjust a level of the corresponding object by being applied to an audio signal.

Thus, the preset information receiving unit 220 of the present invention efficiently represents the preset metadata by reading a bitstream of a necessary amount using the preset length information and is able to effectively adjust a gain of an object included in an audio signal and the like by obtaining the preset matrix based on the output-channel information.

Figure 4:
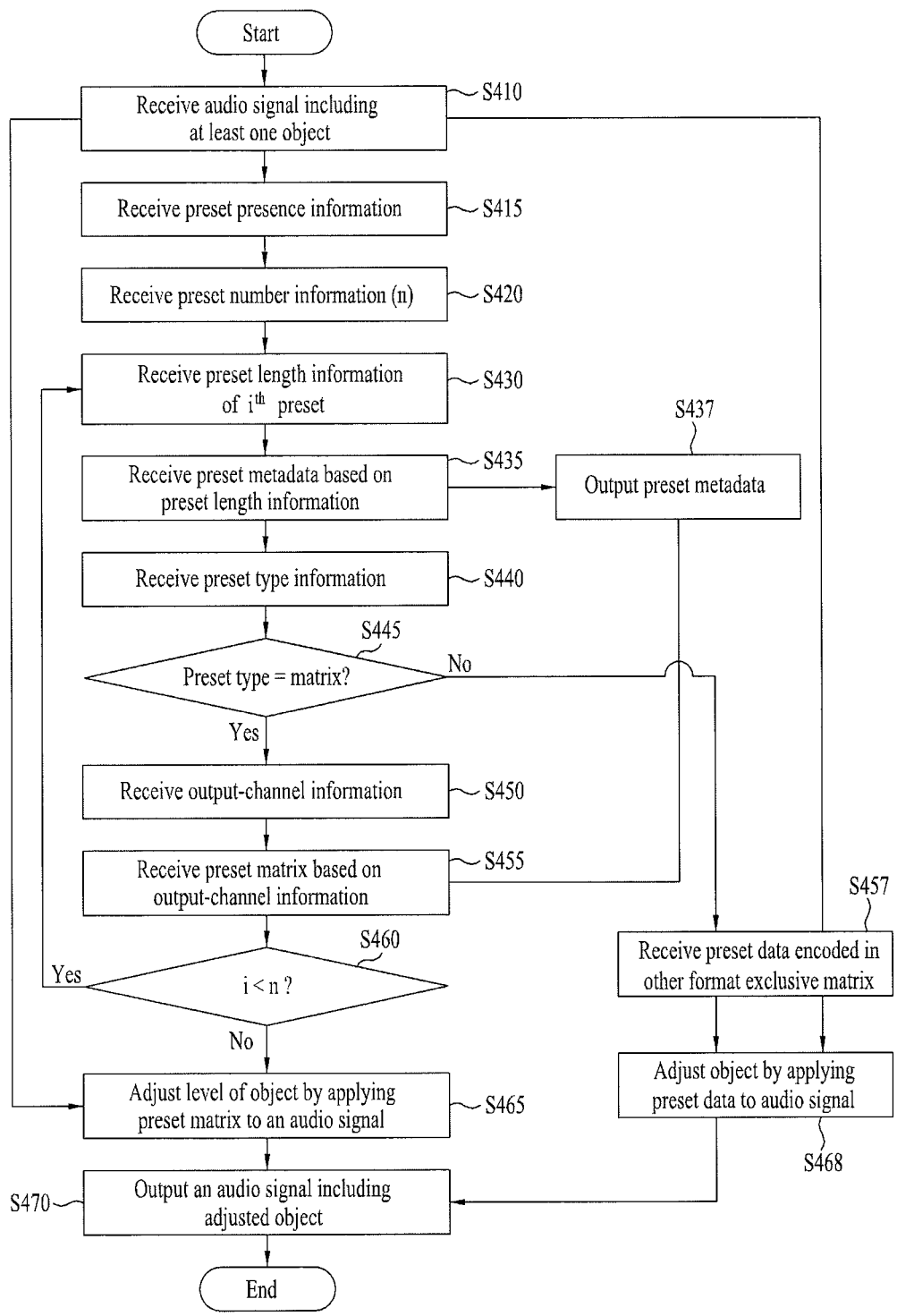
FIG. 4 is a flowchart of a method of processing an audio signal according to an embodiment of the present invention.

FIG. 4 is a flowchart of a method of processing an audio signal according to an embodiment of the present invention.

Referring to FIG. 4, an audio signal including a at least one object is received [S410]. And, preset presence information indicating whether preset information exists to adjust a gain or panning of an object is received [S415]. If the preset information exists, preset number information indicating how many (n) preset information exists is received [S420]. The preset number information assumes that the preset information exists and can be represented as '(the number of actually-existing preset information)−1'. Subsequently, preset length information indicating how many bits (or bytes) metadata for representing the preset information has is received [S430]. Based on the preset length information, preset metadata is received [S435]. For instance, a karaoke mode, a concert hall mode, a news mode or the like is outputted [S437]. In this case, the preset metadata can have a text type. As mentioned in the foregoing description, the preset metadata may include the metadata data disclosing preset information writer, a written date, a name of an object adjusted by preset information or the like as well as the metadata representing a sound stage effect of the preset information, by which examples of the preset metadata are non-limited.

Subsequently, preset type information indicating a type of preset rendering data included in the preset information is received [S440]. Based on the preset type information, it is determined whether a type of the preset data is a matrix type [S445]. If the type of the preset data is the matrix type ['yes' in the step S445], output-channel information indicating how many object channels of an object exist is received [S450]. Based on the output-channel information, a corresponding preset matrix among encoded preset matrix is received [S455]. Dimension of the preset matrix is determined based on number of the object and the number of the output channel. For instance, if an output channel of object is stereo, a received preset matrix will be a stereo preset matrix of '(number of object)*2' type.

It is determined whether i of preset information (ith) including the above-received preset length information, preset metadata, preset type information, output-channel information and preset matrix is smaller than the number (n) of presets indicated by the preset number information [S460]. If the i is smaller than the preset number information ['yes' in the step S460], the routine goes back to the step S430 and then iterates the step of receiving preset length information of a next preset [(i+1)th]. If the ith preset is equal to the preset number information ['no' in the step S460], a level of the object is adjusted by applying the preset matrix to the audio signal [S465]. Meanwhile, if the preset matrix is not presented in matrix['no' in the step S445], preset data implemented in a type except the matrix set up by an encoder is received [S457]. A level of the object is then adjusted by applying the received preset data to the audio signal [S468]. Subsequently, it is able to output an audio signal including the adjusted object [S470].

The step S465 of adjusting the object by applying the preset matrix can use a preset matrix determined by a user's selection [not shown in the drawing]. The user is able to select the preset metadata corresponding to the preset matrix, the preset metadata outputted in the step S437 of the outputting the metadata. For instance, if a user selects metadata represented as a karaoke mode from preset metadata, a preset matrix corresponding to the preset metadata of the karaoke mode is selected from the received preset matrix [S455] based on the output-channel information. Subsequently, a level of the object is adjusted by applying the selected preset matrix corresponding to the karaoke mode to the audio signal. The audio signal including the adjusted object is then outputted.

FIG. 5 is a diagram of a syntax according to an embodiment of the present invention.

Referring to FIG. 5, informations relevant to preset information can exist in a header region of a bitstream. So, it is able to obtain preset number information (bsNumPresets) from the header region of the bitstream.

If the preset number information exists [if (bsNumPresets)], the number of preset information, which is indicated by the preset number information) is obtained [numPresets=bsNumPresets+1]. For instance, if one preset information exists, the preset number information can set 'bsNumPresets' to 0. In this case, the actual number of preset information is recognized and used as '(preset number information)+1'. The preset number information can be firstly received from the bitstream.

Based on the preset number information, it is able to obtain information indicating a type of preset rendering data per preset information (ith preset) (bsPresetType[i]). If a case of transferring the preset rendering data in a matrix type is defined as a specific preset type (a case of transferring bsPresetType[i] when a matrix type), information indicating a type of the preset rendering data can be the aforesaid preset type information (preset_type_flag) indicating whether the preset rendering data was generated and transferred in a matrix type. In this case, the preset type information can be represented as one bit.

If the preset rendering data included in the ith preset information is the matrix type (bsPresetType[i]), output-channel information (bsPresetCh[i]) indicating how many channels an output channel has is obtained. And, a preset matrix for adjusting a level of object included in an audio signal is obtained based on the output-channel information (getRenderingMatrix( )).

FIG. 6 is a diagram of a syntax representing an audio signal processing method according to another embodiment of the present invention. Preset information exists in a header region and can be then applied to all frames identically. Alternatively, preset information is applied variable according to time (hereinafter named 'time-variable') to effectively adjust a level of an object. If preset information is time-variable, information relevant to the preset information should be included per frame. Therefore, information indicating whether preset information is included per frame is included in a header, whereby a bitstream can be effectively configured.

Referring to FIG. 6, a syntax indicating whether the preset information is included per frame is shown. This syntax is similar to the former syntax shown in FIG. 5 which indicates the audio signal processing method shown in FIG. 5. Yet, the syntax shown in FIG. 6 can include preset time-varying flag information (bsPresetTimeVarying[i]) indicating whether preset information exists time-variably, i.e., per frame after output-channel information (bsPresetCh[i]) has been obtained. If the preset time-varying flag information is included in a header region of a bitstream, a level of an object is adjusted using preset matrix and reset metadata included in a frame region of the bitstream. If the preset time-varying flag information exists in a header, it is determined whether there is an update of preset information per frame. If there is no update, a separate flag is set to 'keep'. If there is an update, a separate flag is set to 'read'. Thus, it is able to efficiently set up a bitstream by setting up the separate flag.

Moreover, preset presence information (bsPresetExists) indicating whether preset information exists in a bitstream. If the preset presence information indicates the preset information does not exist in the bitstream, a loop for obtaining preset number information (bsNumPresets), preset type information (bsPresetType[i]), output-channel information (bsPresetCh[i]) and preset time-varying flag information (bsPresetTimeVarying[i]) may not be performed. The preset presence information can be omitted from the syntax if necessary.

FIG. 7 is a diagram of a syntax representing an audio signal processing method according to a further embodiment of the present invention. The above-explained preset matrix is a matrix of '(number of objects)*(number of output channels)' type and indicates contribution degree of the object to output channel. In this case, by receiving to use information on some of the objects only, the number of transferred buts can be reduced in aspect of efficiency. Therefore, a further embodiment of the present invention proposes a syntax for an audio signal processing method for adjusting a specific object only using preset information.

Referring to FIG. 7, a syntax can further include preset object applying information (bsPresetObject[i][j]) indicating whether preset information for adjusting an object level is applied to each object. Using the preset object applying information, it is able to announce whether preset information includes information on a corresponding object. The preset object applying information can exist in a header region of a bitstream. If preset information is time-varying, as shown in FIG. 6, the preset object applying information can exist in a frame. It is able to announce that preset information for each object includes information on the corresponding object, as shown in FIG. 7. And, an object index indicating a presence or non-presence of the inclusion can be included in a bitstream. If the object index is used, it is able to configure a bitstream more conveniently using an exit character.

In case of performing coding in lossless coding using Huffman table or the like, the exit character designs a table to have parameters outnumbering actual parameters by 1. In this case, the additionally allocated parameter can be defined as an exit parameter. In particular, if an exit parameter is obtained from a bitstream, it can be used by being defined as receiving all corresponding information. For instance, if preset information includes information on two of total 10 objects only (information on a 3rd object and information on an 8th object), it is able to effectively configure a bitstream in a manner of transferring Huffman index corresponding to the 3rd and 8th objects and Huffman index corresponding to an exit parameter in turn.

Figure 8:
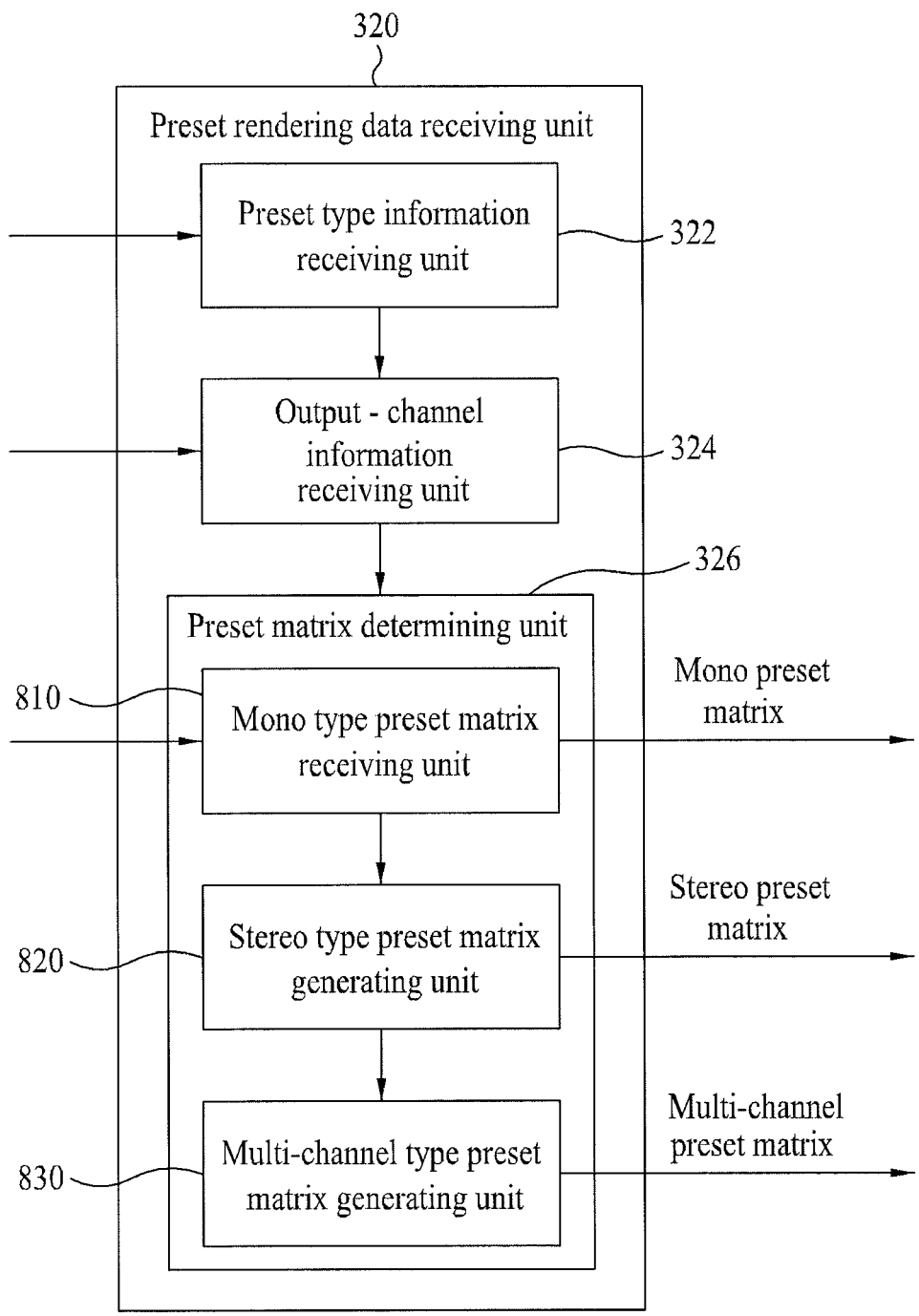
FIG. 8 is a block diagram of a preset rendering data receiving unit according to a further embodiment of the present invention.

FIG. 8 is a block diagram of a preset rendering data receiving unit for generating a preset matrix step by step according to a further embodiment of the present invention.

Referring to FIG. 8, a preset rendering data receiving unit 320 includes a preset data type flag receiving unit 322, an output-channel information receiving unit 324 and a preset matrix determining unit 326. The rest of elements have the same configurations and effects of the present rendering data receiving unit 224/320 shown in FIG. 2/3 and their details will be omitted in the following description.

Meanwhile, the preset matrix determining unit 326, a shown in FIG. 8, includes a mono type preset matrix receiving unit 810, a stereo type preset matrix generating unit 820 and a multi-channel type preset matrix generating unit 830.

The mono type preset matrix receiving unit 810 receives a mono preset matrix represented as a matrix of 'number of objects) type from a preset generating unit (not shown in the drawing). If output-channel information received from the output-channel information receiving unit 324 is mono, the mono preset matrix is outputted as it is. The outputted mono preset matrix is applied to an audio signal to adjust a level of object.

Meanwhile, if the output-channel information is stereo, the mono preset matrix is inputted to the stereo type preset matrix generating unit 820. Channel extension information is further inputted to generate a stereo preset matrix of '(number of objects)*2' type. If the output-channel information indicates a multi-channel, the stereo preset matrix and multi-channel extension information are inputted to the multi-channel type preset matrix generating unit 830 to generate a multi-channel preset matrix of '(number of objects)*6' type.

Thus, an encoder generates a mono preset matrix only and the preset matrix determining unit 326 generates a preset matrix step by step using the channel extension information. Hence, if a playback configuration is limited to stereo only, it is able to save the number of transported bits. And, a preset matrix for a stereo or multi channel may not be transferred redundantly.

An audio signal processing method according to a further embodiment of the present invention proposes a method of transferring a gain value in transmitting preset information or transmitting a normalized preset matrix if necessary. This can be extended to a method of transmitting a gain value only if a gain is needed to adjust an object included in an audio signal or transmitting a whole preset matrix with ease. For instance, in order to transfer a preset matrix shown in Formula 1, n*6 gain informations should be transmitted in the first place. In this case, the gain information can be calculated as Formula 2.

$$G_i = \sum_{j=0}^{nCH} m_{i,j}^2 \quad \text{[Formula 2]}$$

In Formula 2, 'i' indicates an object, 'j' indicates an output channel, and 'nCH' indicates the number of output channels. Since the Gi exist as many as the number of objects, the number of n is required for preset information.

If panning information is necessary as well as the gain information, a normalized preset matrix is additionally used. In this case, the normalized preset matrix can be defined as Formula 3.

$$M_{norm} = \begin{bmatrix} \hat{m}_{0,Lf} & \hat{m}_{0,Rf} & \cdots \\ \cdots & \cdots & \cdots \\ \hat{m}_{N-1,Lf} & \cdots & \cdots \end{bmatrix} \quad \text{[Formula 3]}$$

$$\hat{m}_{i,j} = \frac{m_{i,j}}{G_i}$$

In case of using the gain information and the normalized preset matrix in the above-explained manner, n*6 gain informations should be transferred. Yet, due to normalization characteristics, there is such a characteristic as $0 \leq \hat{m} \leq 1$ and a value of log 10 of $\hat{m}^2$ is always equal to or smaller than 0. Hence, in case of using a table of channel level difference information for quantization of gain information, a half of the related art table is used only. This can save a size of necessary data as well as bitrate rather than receiving to use a non-normalized preset matrix without transferring gain information separately. Moreover, since gain information can be included in preset information only, it is able to use the preset information in scalable way.

FIG. 9 is a diagram of a syntax according to another further embodiment of the present invention, in which gain information and panning relevant information are transferred by being separately included in the preset information. The gain information and the panning information can be included in a header or frame region.

Referring to FIG. 9, an Italic part indicates that an actual preset value is received from a bitstream. Various noiseless coding schemes are available and are represented as functions in FIG. 9. For instance, if the above informations exist in the frame region, it is checked whether preset information exists. If the preset information exists, preset number information is received. Subsequently, gain information is received in the first place. The gain information is the information indicating that a corresponding object will be reproduced into a prescribed gain value. In this case, the gain information can be the aforesaid G_i or an arbitrary downmix gain (hereinafter abbreviated ADG) generated if a level of audio signal is adjusted by an external input value.

Additionally obtained panning information can have one of various types. The panning information can include the aforesaid normalized preset matrix. And, the panning information can be divided into stereo panning information and multi-channel panning information.

Figure 10:
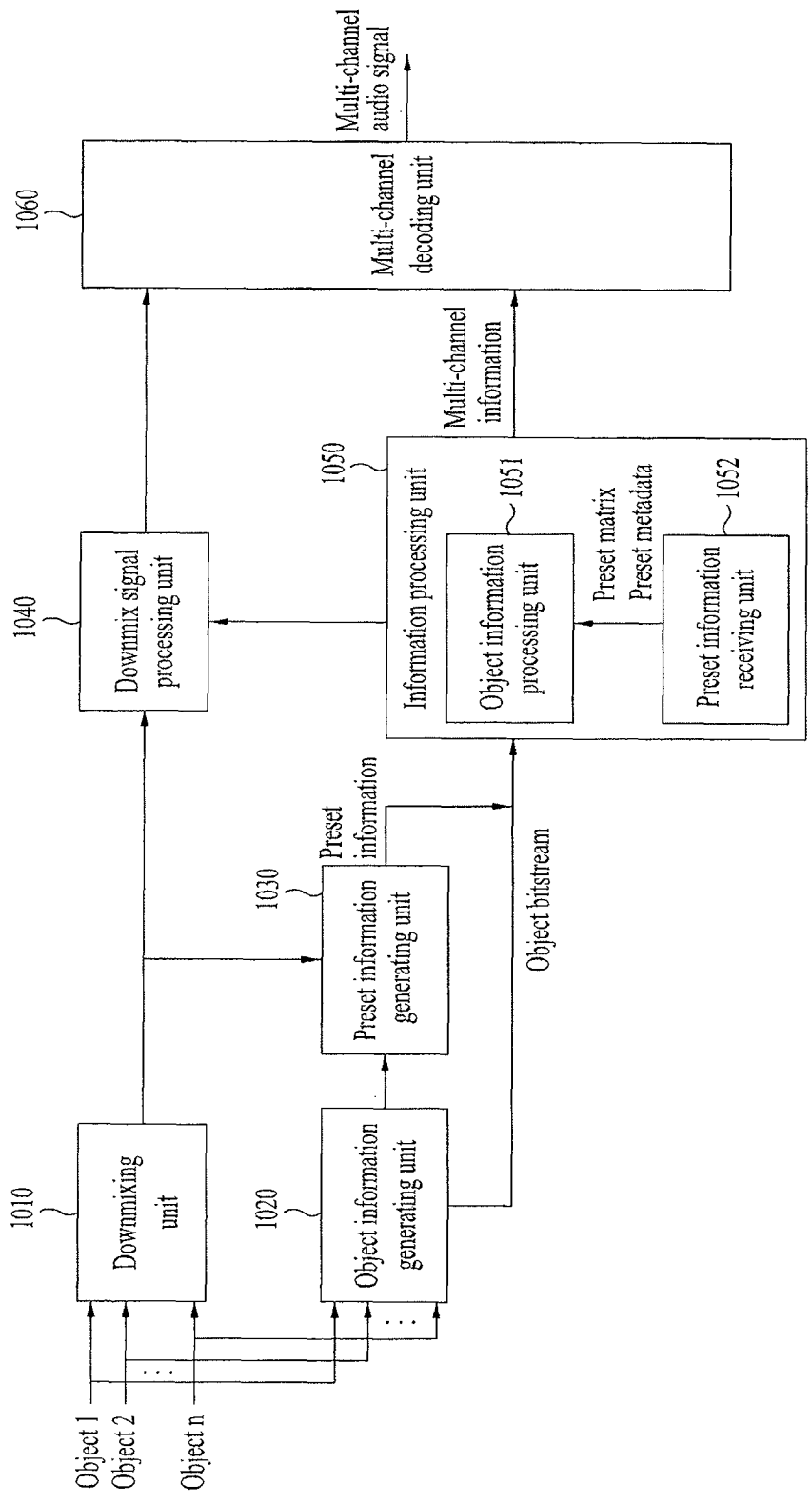
FIG. 10 is a block diagram of an audio signal processing apparatus according to another embodiment of the present invention.

FIG. 10 is a block diagram of an audio signal processing apparatus according to another embodiment of the present invention.

Referring to FIG. 10, an audio signal processing apparatus according to another embodiment of the present invention mainly includes a downmixing unit 1010, an object information generating unit 1020, a preset information generating unit 1030, a downmix signal processing unit 1040, an information processing unit 1050 and a multi-channel decoding unit 1060.

First of all, a plurality of objects are inputted to the downmixing unit 1010 and then generated into a mono or stereo downmix signal. A plurality of the objects are also inputted to the object information generating unit 1020 and then generated into object level information indicating a level of object, object gain information indicating an extent of object included in a downmix channel in case of a gain value of object included in a downmix signal and/or a stereo downmix signal, and object information including object correlation information indicating correlation or non-correlation between objects.

Subsequently, the downmix signal and the object information are inputted to the preset information generating unit 1030 to be generated into preset information including preset rendering data for adjusting the level of the object and preset metadata for representing the preset information. A process for generating the preset rendering data and the preset metadata is as good as explained in the foregoing description of the audio signal processing apparatus and method shown in FIGS. 1 to 9, of which details will be omitted in the following description. Meanwhile, the object information generated by the object information generating unit 1020 and the preset information generated by the preset information generating unit 1030 can be transferred by being included in SAOC bitstream.

The information processing unit 1050 includes an object information processing unit 1051 and a preset information receiving unit 1052. And, the information processing unit 1050 receives the SAOC bitstream.

The preset information receiving unit 1052 receives the above-mentioned preset presence information, preset number information, preset length information, preset metadata, preset type information, output-channel information and preset matrix from the SAOC bitstream and uses the methods according to the various embodiments explained for the audio signal processing method and apparatus shown in FIGS. 1 to 9. And, the preset information receiving unit 1052 outputs preset metadata and preset matrix. The object information processing unit 1051 receives the preset metadata and the preset matrix and then generates downmix processing information for preprocessing a downmix signal and multi-channel information for upmixing the downmix signal using the object information included in the SAOC bitstream together with the preset metadata and the preset matrix.

Subsequently, as the downmix processing information is inputted to the downmix signal processing unit 1040, it is able to perform panning of the object included in the downmix signal. The above-preprocessed downmix signal is inputted to the multi-channel decoding unit 1060 together with the multi-channel information outputted from the information processing unit 1050 and is then upmixed to generate a multi-channel audio signal.

Thus, in decoding an audio signal including a plurality of objects into a multi-channel signal using object information, an audio signal processing apparatus according to the present invention is facilitated to adjust a level of the object using preset information. In doing so, the audio signal processing apparatus according to the present invention effectively performs a level adjustment of object using matrix type data received based on output-channel information as a preset matrix applied to the object. And, the audio signal processing apparatus according to the present invention is able to enhance coding efficiency by outputting preset metadata based on preset length information transferred from an encoder side.

Figure 11:
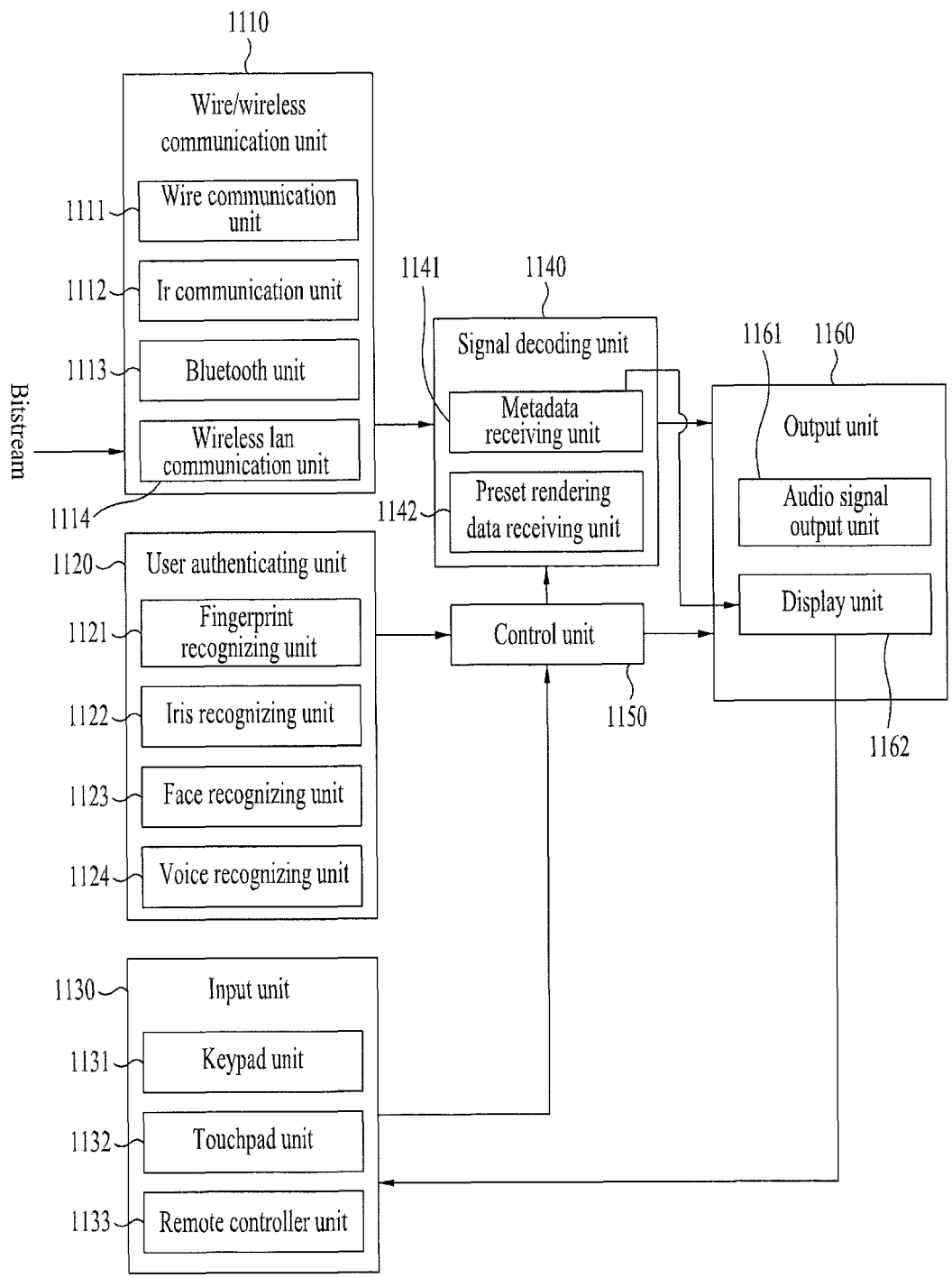
FIG. 11 is a schematic block diagram of a preset receiving unit implemented product according to an embodiment of the present invention.
Figure 12:
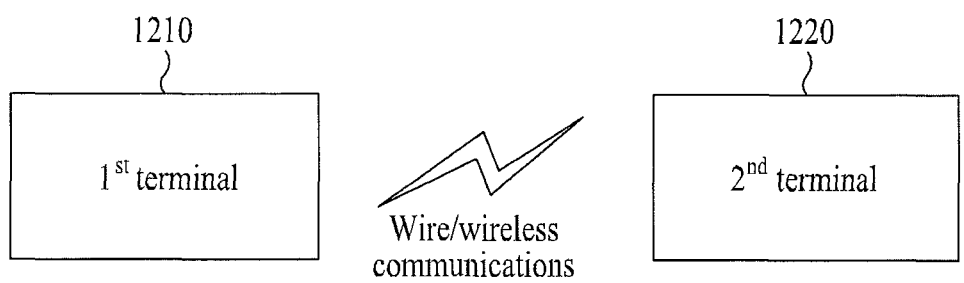
FIG. 12 is a diagram for relations between a terminal and a server corresponding to the products shown in FIG. 11.
Figure 12:
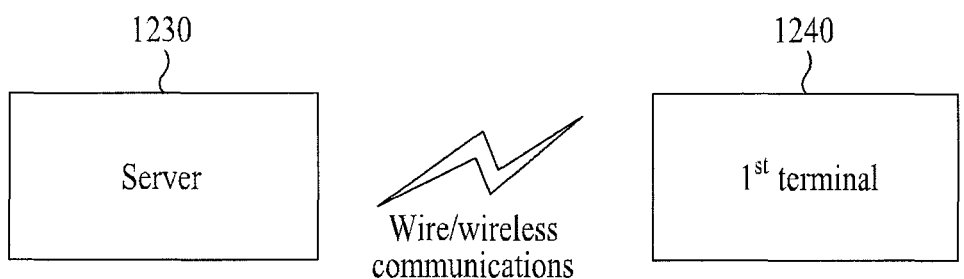

FIG. 11 is a schematic block diagram of a product implementing a preset information receiving unit including a metadata receiving unit and a preset rendering data receiving unit according to an embodiment of the present invention, and FIG. 12 is a diagram for relations between a terminal and a server corresponding to the products shown in FIG. 11.

Referring to FIG. 11, a wire/wireless communication unit 1110 receives a bitstream by wire/wireless communication system. In particular, the wire/wireless communication unit 1110 can include at least one selected from the group consisting of a wire communication unit 1111, an infrared communication unit 1112, a Bluetooth unit 1113 and a wireless LAN communication unit 1114.

A user authenticating unit 1120 receives an input of user information and then performs user authentication. The user authenticating unit 1120 can include at least one selected from the group consisting of a fingerprint recognizing unit 1121, an iris recognizing unit 1122, a face recognizing unit 1123 and a voice recognizing unit 1124. In this case, the user authentication can be performed in a manner of receiving an input of fingerprint information, iris information, face contour information or voice information, converting the inputted information to user information, and then determining whether the user information matches registered user data.

An input unit 1130 is an input device enabling a user to input various kinds of commands. And, the input unit 1130 can include at least one selected from the group consisting of a keypad unit 1131, a touchpad unit 1132 and a remote controller unit 1133, by which examples of the input unit 1130 are non-limited. Meanwhile, if preset metadata for preset information outputted from a metadata receiving unit 1141, which will be explained later, are visualized on a screen via a display unit 1162, a user is able to select the preset metadata via the input unit 1130 and information on the selected preset metadata is inputted to a control unit 1150.

A signal decoding unit 1140 includes a metadata receiving unit 1141 and a preset rendering data receiving unit 1142. The metadata receiving unit 1141 receives preset length information and then receives preset metadata based on the received preset length information. If a preset is represented as a matrix by preset type information, the preset rendering data receiving unit 1142 receives output-channel information and then receives a preset matrix, which is preset rendering data, based on the received output-channel information. The signal decoding unit 1140 generates an output signal by decoding an audio signal using the received bitstream, preset metadata and preset matrix and outputs the preset metadata of a text type.

A control unit 1150 receives input signals from the input devices and controls all processes of the signal decoding unit 1140 and an output unit 1160. As mentioned in the foregoing description, if information on selected preset metadata is inputted to the control unit 1150 from the input unit 1130, the preset rendering data receiving unit 1142 receives a preset matrix corresponding to the selected preset metadata and then decodes an audio signal using the received preset matrix.

And, an output unit 1160 is an element for outputting an output signal and the like generated by the signal decoding unit 1140. the output unit 1160 can include a speaker unit 1161 and a display unit 1162. If an output signal is an audio signal, it is outputted via the speaker unit 1161. if an output signal is a video signal, it is outputted via the display unit 1162. Moreover, the output unit 1160 visualizes the preset metadata inputted from the control unit 1150 on a screen via the display unit 1162.

FIG. 12 shows relations between terminals or between a terminal and a server, each of which corresponds to the product shown in FIG. 11.

Referring to (A) of FIG. 12, it can be observed that bidirectional communications of data or bitstreams can be performed between a first terminal 1210 and a second terminal 1220 via wire/wireless communication units.

Referring to (B) of FIG. 12, it an be observed that wire/wireless communications can be performed between a server 1230 and a first terminal 1240.

Figure 13:
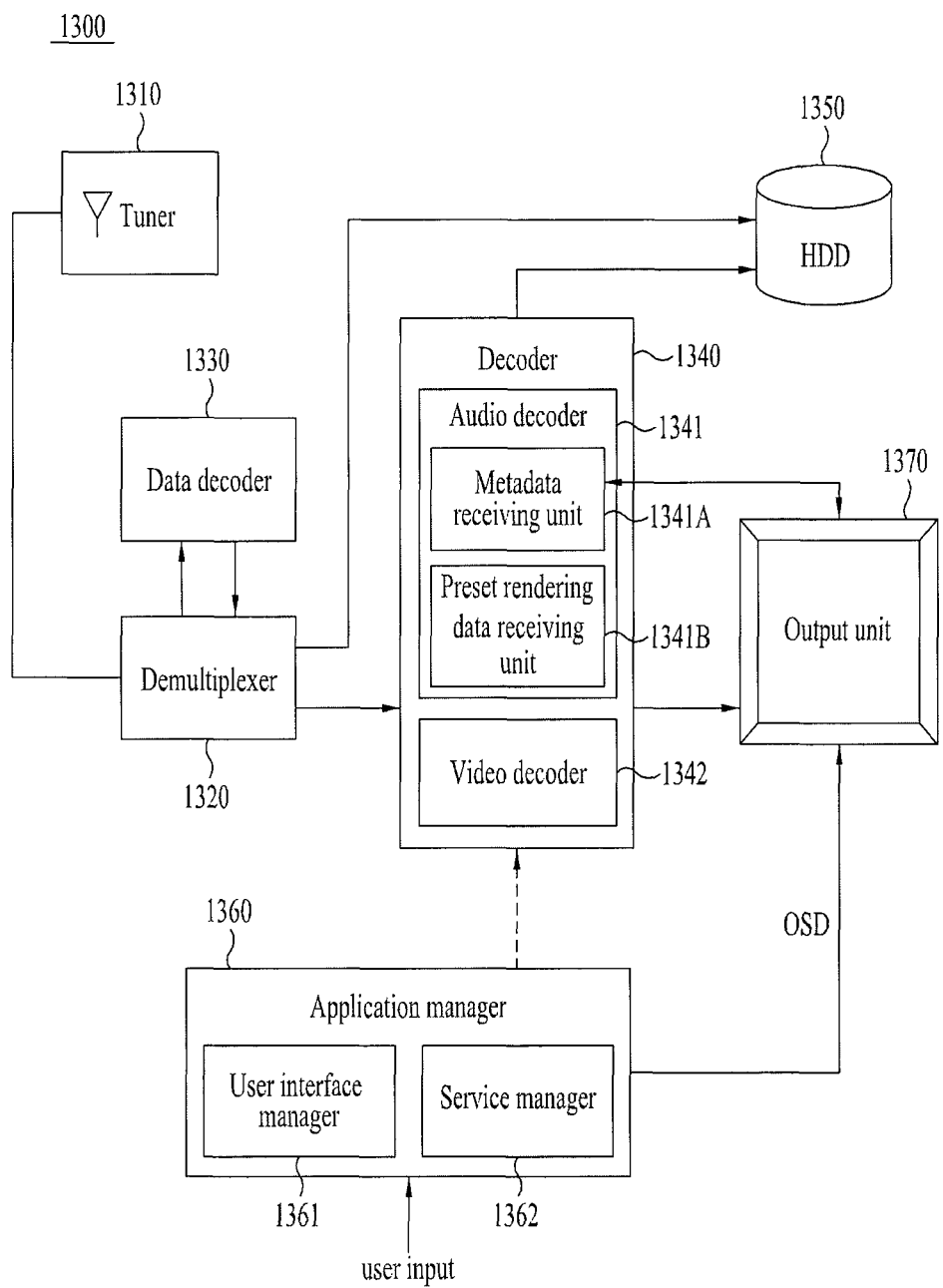
FIG. 13 is a schematic block diagram of a preset receiving unit implemented digital TV according to an embodiment of the present invention.

FIG. 13 is a schematic block diagram of a broadcast signal decoding device 1300 implementing a preset information receiving unit including a metadata receiving unit and a preset rendering data receiving unit according to one embodiment of the present invention.

Referring to FIG. 13, a demultiplexer 1320 receives a plurality of data related to a TV broadcast from a tuner 1310. The received data are separated by the demultiplexer 1320 and are then decoded by a data decoder 1330. Meanwhile, the data separated by the demultiplexer 1320 can be stored in such a storage medium 1350 as an HDD. The data separated by the demultiplexer 1320 are inputted to a decoder 1340 including an audio decoder 1341 and a video decoder 1342 to be decoded into an audio signal and a video signal. The audio decoder 1341 includes a metadata receiving unit 1341A and a preset rendering data receiving unit 1341B according to one embodiment of the present invention. The metadata receiving unit 1341A receives preset length information and then receives preset metadata based on the received preset length information. If preset information is represented in a matrix, the preset rendering data receiving unit 1341B receives output-channel information and then receives a preset matrix, which is preset rendering data, based on the received output-channel information. The audio decoder 1341 generates an output signal by decoding an audio signal using the received bitstream, preset metadata and preset matrix and outputs the preset metadata of a text type.

A display unit 1370 visualizes the video signal outputted from the video decoder 1342 and the preset metadata outputted from the audio decoder 1341. The display unit 1370 includes a speaker unit (not shown in the drawing). And, an audio signal, in which a level of an object outputted from the audio decoder 1341 is adjusted using the preset matrix, is outputted via the speaker unit included in the display unit 1370. Moreover, the data decoded by the decoder 1340 can be stored in the storage medium 1350 such as the HDD.

Meanwhile, the signal decoding device 1300 can further include an application manager 1360 capable of controlling a plurality of data received by having information inputted from a user.

The application manager 1360 includes a user interface manager 1361 and a service manager 1362. The user interface manager 1361 controls an interface for receiving an input of information from a user. For instance, the user interface manage 1361 is able to control a font type of text visualized on the display unit 1370, a screen brightness, a menu configuration and the like. Meanwhile, if a broadcast signal is decoded and outputted by the decoder 1340 and the display unit 1370, the service manager 1362 is able to control a received broadcast signal using information inputted by a user. For instance, the service manager 1362 is able to provide a broadcast channel setting, an alarm function setting, an adult authentication function, etc. The data outputted from the application manager 1360 are usable by being transferred to the display unit 1370 as well as the decoder 1340.

Figure 14:
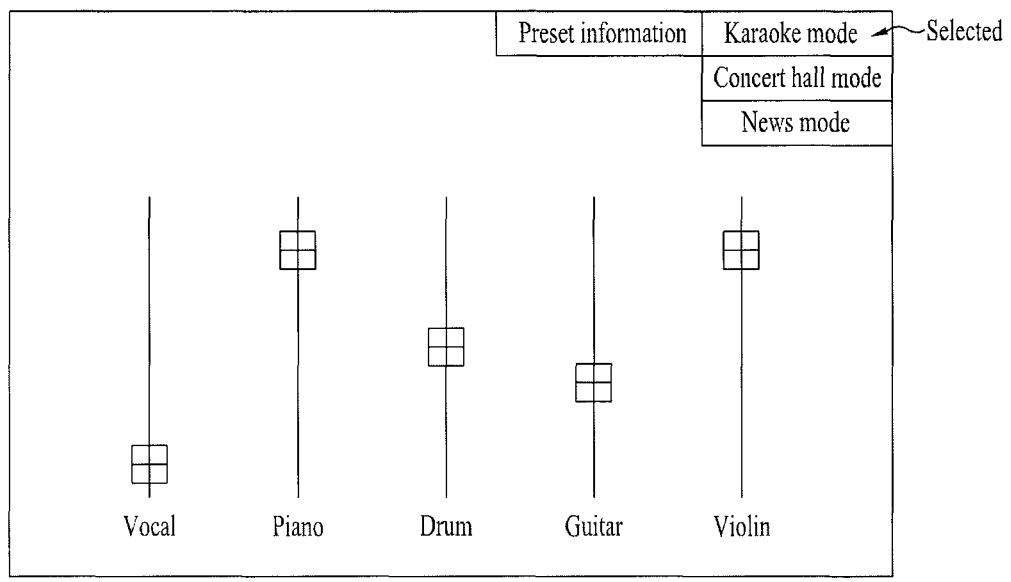
FIG. 14 is a diagram of a display unit of a product including a preset receiving unit according to one embodiment of the present invention.
Figure 14:
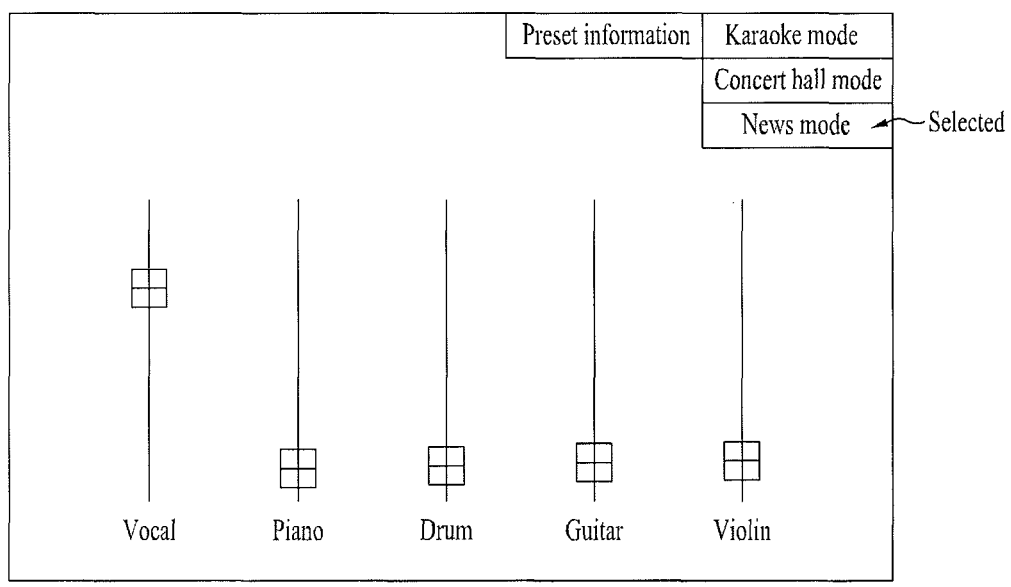

FIG. 14 is a diagram of a display unit of a product including a preset information receiving unit according to one embodiment of the present invention. A display unit is able to visualize all preset metadata included in a bitstream. For instance, karaoke mode, concert hall mode and news mode, as shown in FIG. 14, are entirely visualized on a screen.

If a user selects one of the preset metadata, the display unit visualizes objects of which levels are adjusted in a manner that a preset matrix corresponding to the karaoke mode is applied to a plurality of objects. For instance, if a user selects the karaoke mode, a configuration of setting a level of a vocal object to a minimum can be visualized. Moreover, if a user selects the news mode, a preset matrix applied to an audio signal will lower levels of objects except a vocal object.

Referring to FIG. 14, if the news mode is selected, the display unit is able to visualize a configuration that a level of a vocal object is raised higher than that in the karaoke mode while levels of the rest of objects are set to minimums.

Therefore, in a manner of visualizing levels of objects adjusted by a preset matrix as well as the preset metadata indicating a preset on a display unit, a user is able to listen to an audio signal having a specific sound sage effect by selecting a specific preset mode appropriately.

Accordingly, the present invention is applicable to encoding and decoding audio signals.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

What is claimed is:

1. A method of processing an audio signal, the method comprising:
   receiving, at a decoding apparatus, the audio signal, wherein the audio signal includes a plurality of objects;
   receiving, at the decoding apparatus, object information including object level information indicating a level of the plurality of objects, object gain information indicating gains of each of the plurality of objects, and object correlation information indicating correlation between the plurality of objects;
   receiving, at the decoding apparatus, preset presence information and preset number information, the preset presence information indicating that preset information is available, and the preset number information indicating a number of the preset information;
   receiving, at the decoding apparatus, the preset information based on the preset presence information and the preset number information, the preset information including preset metadata representing an attribute mode of the preset information, preset rendering data for rendering the plurality of objects and preset type information indicating whether the preset rendering data is in a matrix type or is defined by a user,
   wherein the preset information is applied to control the plurality of objects included in the audio signal,
   wherein the preset information exists in a header region or in each frame,
   wherein when the preset information exists in the header region, the preset information is applied to all frames, and
   wherein when the preset information exists in the each frame, then the preset information is applied to a corresponding frame;
   obtaining, at the decoding apparatus, a preset matrix from the user by an input unit of the audio decoding apparatus when the preset type information indicates the preset rendering data is defined by the user,
   wherein one attribute mode is selected by the user from the preset metadata, and
   wherein the preset matrix corresponding to the selected attribute mode is obtained from the preset rendering data;
   adjusting, at the decoding apparatus, an output level of the plurality of objects for an output channel based on the object information and the preset matrix; and
   outputting, from the decoding apparatus, an adjusted audio signal including the plurality of objects with an adjusted output level.

2. The method of claim 1, wherein the preset type information is represented in 1 bit.

3. The method of claim 1, further comprising:
   determining a dimension of the preset matrix based on a number of the objects and a number of output channels.

4. An apparatus for processing an audio signal, the apparatus comprising:
   an audio signal receiving unit configured to receive the audio signal, the audio signal including a plurality of objects;
   an object information receiving unit configured to receive object information including object level information indicating a level of the plurality of objects, object gain information indicating gains of each of the plurality of objects, and object correlation information indicating correlation between objects;
   a preset information receiving unit configured to receive preset presence information and preset number information, the preset presence information indicating that the preset information is available, and the preset number information indicating that a number of the preset information,
   wherein the preset information receiving unit is further configured to receive preset information based on the preset presence information and preset number information, the preset information including a preset metadata representing an attribute mode of the preset information, preset rendering data for rendering the plurality of objects and preset type information indicating whether the preset rendering data is in a matrix type or is defined from user,
   wherein the preset information is applied to control the plurality of objects included in the audio signal,
   wherein the preset information exists in a header region or in each frame, wherein when the preset information exists in the header region, the preset information is applied to all frames, and wherein when the preset information exists in the each frame, then the preset information is applied to a corresponding frame;

an input unit configured to obtain a preset matrix from the user when the preset type information indicates the preset rendering data is defined by the user, wherein one attribute mode is selected by the user from the preset metadata, and wherein the preset matrix corresponding to the selected attribute mode is obtained from the preset rendering data;

an object adjusting unit configured to adjust an output level of the plurality of objects for an output channel based on the object information and the preset matrix; and an output unit configured to output an adjusted audio signal including the plurality of objects with an adjusted output level, wherein the data receiving unit is further configured to obtain the preset matrix based on the preset type information.

5. The apparatus of claim 4, wherein the preset type information is represented in 1 bit.

6. The apparatus of claim 4, wherein a dimension of the preset matrix is determined based on a number of the objects and a number of output channels.

\* \* \* \* \*